United States Patent
Maeda (10) Patent No.: US 6,373,784 B2
(45) Date of Patent: Apr. 16, 2002

(54) SEMICONDUCTOR MEMORY DEVICE (75) Inventor: Kazunori Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/764,480

(22) Filed: Jan. 17, 2001

(30) Foreign Application Priority Data

Jan. 20, 2000 (JP) .......................................... 12-011932

(51) Int. Cl.$^7$ ................................................. G11C 8/00
(52) U.S. Cl. ...................................... 365/233; 365/194
(58) Field of Search ............................... 365/233, 194, 365/201

(56) References Cited

U.S. PATENT DOCUMENTS

| | | | | |
|---|---|---|---|---|
| 5,969,999 A | * | 10/1999 | Lee | 365/194 |
| 6,154,415 A | * | 11/2000 | Jeong | 365/233 |
| 6,269,050 B1 | * | 7/2001 | Kwon et al. | 365/233 |
| 6,275,086 B1 | * | 8/2001 | Douchi et al. | 365/233 |
| 6,275,444 B1 | * | 8/2001 | Nakano et al. | 365/233 |

* cited by examiner

*Primary Examiner*—Trong Phan
(74) *Attorney, Agent, or Firm*—Darryl G. Walker (57) ABSTRACT

A semiconductor device, such as a SDRAM, having internal signals (FICLK and ICLK) generated with similar timings with respect to each other, even when operating at a frequency that is too low for proper operation of a synchronous circuit (103). According to one embodiment, the semiconductor device may include an internal signal generator (100) having a first stage circuit (101), timing control circuit (110) and synchronous circuit (103). The first stage circuit (101) may receive an external CLK and generate an internal signal ICLK'. The timing control circuit (110) may be coupled to receive internal signal ICLK' and generate internal signal ICLK'. The synchronous circuit (103) may be coupled to receive internal signal ICLK' and generate internal signal FICLK. Internal signals (FICLK and ICLK) may have a timing with respect to one another in a normal mode of operation. When operating at a frequency too low for a synchronous circuit (103), internal signal generator (100) may include a test mode of operation in which timing control circuit (110) allows internal signals (FICLK and ICLK) to have similar timings with respect to one another in the test mode as in a normal mode of operation.

20 Claims, 6 Drawing Sheets

SEMICONDUCTOR MEMORY DEVICE

TECHNICAL FIELD

The present invention relates generally to semiconductor memory devices, and more particularly to synchronous semiconductor memory devices having a frequency synchronous circuit that produces an internal signal for controlling the timing to read data.

BACKGROUND OF THE INVENTION

A synchronous semiconductor memory reads and writes data synchronously with an external clock (CLK). As the frequency of a CLK signal in a synchronous semiconductor memory device, such as a synchronous dynamic random access memory (SDRAM), has increased, it has become necessary to decrease the data access time. A data access time can be the time from an external clock edge to the output of valid data. In an SDRAM the data access time may be determined by timing the data output with an internal signal ICLK (internal clock) produced by a delay operation. When it is difficult to realize the desired data access time with this approach, the data output timing can be controlled by an internal signal FICLK, which is generated by a synchronous circuit that has a frequency determined by the frequency of CLK. In a high speed memory device, such as a DDR (double data rate) SDRAM, data output is typically controlled by an FICLK signal produced by a synchronous circuit.

Various types of circuits may be used as the synchronous circuit. One such circuit is a DLL (delay locked loop). In this case, internal signal FICLK is produced by detecting a cycle of internal signal ICLK. In a semiconductor memory device that uses a synchronous circuit for outputting data, internal signal FICLK which is synchronized with the external CLK, will have a different timing than internal signal ICLK, which is synchronized with the external CLK.

In a read operation for a semiconductor memory device that uses a synchronous circuit, data output timing is controlled by using FICLK to trigger an output circuit to output data from the memory device. Depending on the construction of the data path, FICLK may also control the transmission of data in the data path upstream from the output circuit. For example, it may be used as the triggering signal for a data latch circuit, thus timing the transmission of data at a point before the data reaches the output circuit. This may be needed to improve operating margins when the data may not have propagated from the memory array to the data latch circuit at an earlier time in a read cycle. This will be explained below with reference to FIGS. 7, 8a and 8b.

Figure 7:
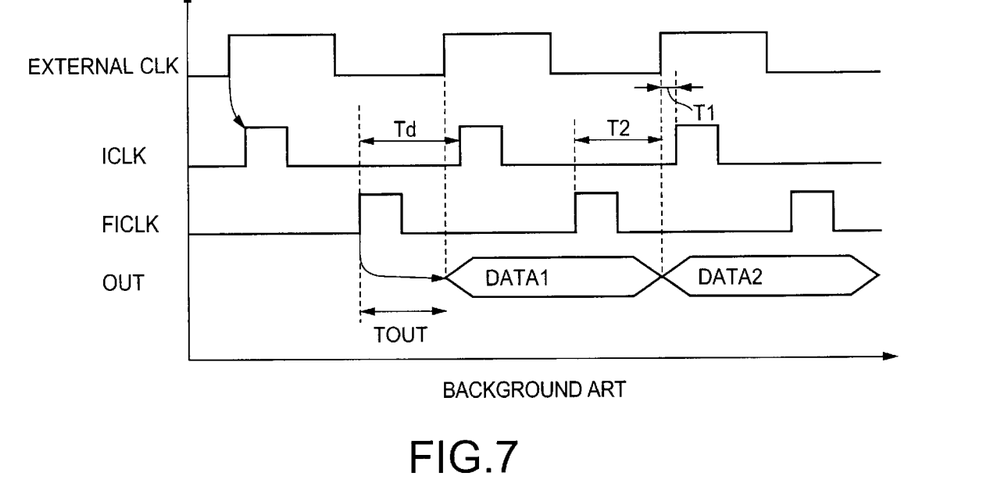
FIG. 7 is a timing diagram illustrating data read timing in a semiconductor memory device.

Referring to FIG. 7, a timing diagram illustrating data read timing in a semiconductor memory device is set forth. FIG. 7 shows the external clock CLK, internal signal ICLK, internal signal FICLK, and output data out.

As shown in FIG. 7, internal signal ICLK is generated at a delay of T1 after the rising edge of CLK. Internal signal FICLK is generated by the synchronous circuit based on the internal signal ICLK such that the rising edge of FICLK occurs at a time T2 from the rising edge of CLK. This is done by adjusting the synchronous circuit based on the knowledge of the time it takes data to propagate up to the output circuit. To prevent incorrect data from being output, the data must have propagated up to the output circuit by the time that the rising edge of FICLK is generated. FICLK can enable the output circuit and data can propagate to the output in a time of Tout.

Figure 8A:
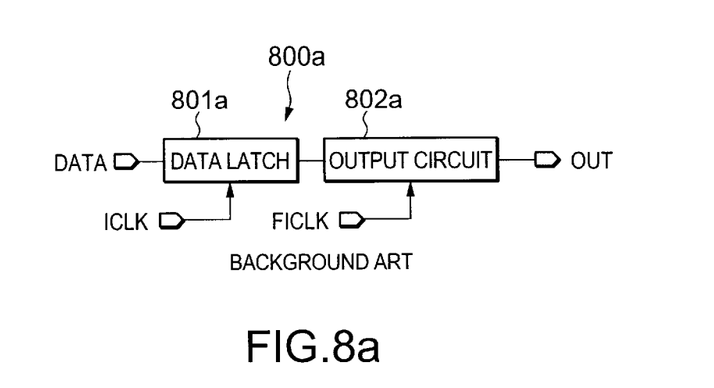
FIG. 8a is a block schematic diagram illustrating a portion of a data path in a semiconductor memory device.

Referring now to FIG. 8a, a block schematic diagram illustrating a portion of the data path in a semiconductor memory device is set forth and given the general reference character 800a. The data path 800a may include a data latch 801a and an output circuit 802a. The data latch 801a receives data on a data line and transmits the data to the output circuit 802a synchronously with the internal signal ICLK. The output circuit 802a receives the data from the data latch 801a and outputs the data synchronously with the internal signal FICLK. When the data path 800a is controlled as shown in FIG. 8a, the data patch 800a operation may be adversely affected as cycle times get smaller. For example, if a cycle time is 10 ns, T1=2 ns, and T2=2 ns, data can take 10 ns−T1−T2=6 ns to be transmitted through an output circuit, thus no problem will typically arise.

However, when the cycle time is 6 ns in the example above, data must be transmitted through an output circuit in 10 ns−T1−T2=2 ns, such a time may result in an operating margin that is insufficient due to propagation delays and bus capacitance. This may cause incorrect data to be transmitted in some cases. Thus, in the given example, when data is to be outputted in a time faster than or equal to 2 ns, the operating margin may be insufficient.

Figure 8B:
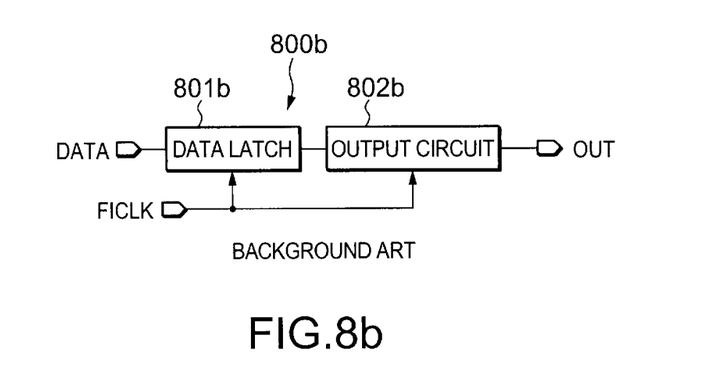
FIG. 8b is a block schematic diagram illustrating a portion of a data path in a semiconductor memory device.

Referring now to FIG. 8b, a block schematic diagram illustrating a portion of the data path in a semiconductor memory device is set forth and given the general reference character 800b. The data path 800b may include a data latch 801b and an output circuit 802b. The data latch 801b receives data on a data line and transmits the data to the output circuit 802b synchronously with the internal signal FICLK. The output circuit 802a receives the data from the data latch 801b and also outputs the data synchronously with the internal signal FICLK.

In a data path 800b as illustrated in FIG. 8b, a timing for data transmission can be kept constant irrespective of the cycle time because internal signal FICLK is used both as triggering signal for the output circuit 800b and the data latch 800b. Accordingly, this configuration is effective when the synchronous circuit is used in a high speed memory device.

As in the above mentioned method, a synchronous circuit produces FICLK by detecting the cycle of the internal signal ICLK. A synchronous circuit's ability to properly synchronize the internal clock FICLK with the internal clock ICLK is dependent on the frequency of the cycle and the design of the synchronous circuit. When the synchronous circuit is designed to permit synchronization with an excessively long (lower frequency) cycle, the area of the synchronous circuit is increased. Due to the increased sizes, inaccuracies may be magnified and thus operating characteristics can degenerate. Thus, a synchronous circuit is typically used under the premise that it will be operated at a relatively high frequency. The synchronous circuit is then designed to a scale that allows a certain operating margin with respect to a maximum (MAX) value of a CLK cycle time or a minimum CLK frequency.

In some cases, the MAX value of a CLK cycle time for the operation of the synchronous circuit cannot be achieved by a certain test setup. This is particularly true when the synchronous circuit is designed to operate at a high CLK frequency. In fact, sometimes the tester and/or test system is so limited that the test cannot be conducted at a high enough frequency for the synchronous circuit to properly operate. This is particularly true for tests such as multi-probe or laser-probe, which are performed on devices still in wafer form. In such cases, large parasitics caused by the test signal wirings, probes and/or probe contacts can slow operating frequencies. It is also particularly true on tests such as burn-in, in which large quantities of packaged parts are tested in parallel in order to drive out infant mortality and/or obtain statistical data on the devices in general.

Figure 9:
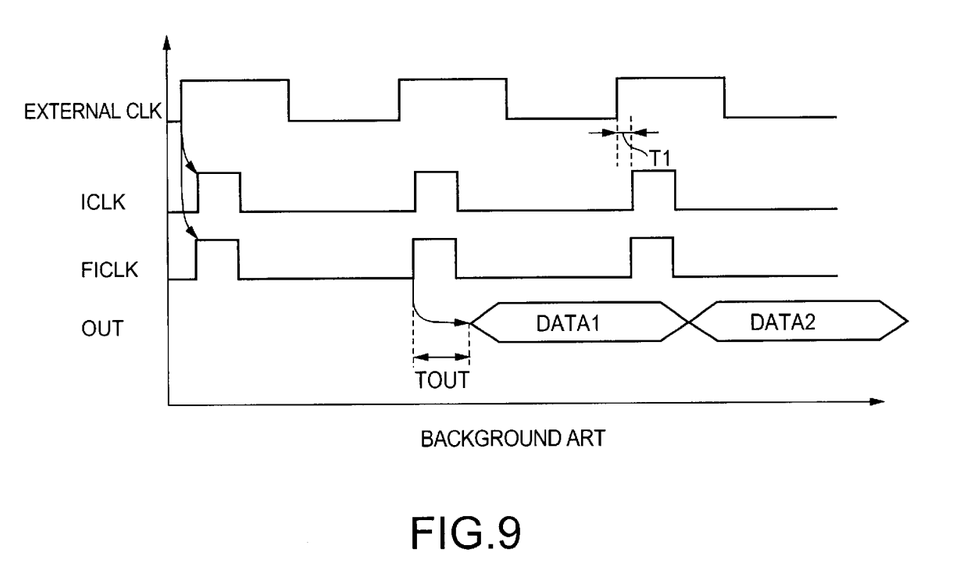
FIG. 9 is a timing diagram illustrating data read timing in a semiconductor memory device operating in a test mode.

In cases in which the test cannot be conducted at a high enough frequency to ensure the proper operation of the synchronous circuit, the semiconductor memory device is tested in a test mode in which the synchronous circuit is disabled. This particular case is shown in FIG. 9. Referring to FIG. 9, a timing diagram illustrating data read timing in a semiconductor memory device operating in a test mode, in which a synchronous circuit is disabled, is set forth. FIG. 9 shows the external clock CLK, internal signal ICLK, internal signal FICLK, and output data DATA. In the test mode operation of FIG. 9, the internal signal FICLK is not synchronized with the internal signal ICLK. Instead the internal signal FICLK is produced by a delay of the external CLK. Thus, the internal signal FICLK is generated with a timing equal to the timing of the internal signal ICLK or perhaps a timing later than the timing of ICLK due to a slight increase in the number of logic gates in which the internal signal FICLK must propagate through.

When operating under the test mode in which the synchronous circuit is disabled, timing of internal signal ICLK and the internal signal FICLK is different than the normal case in which the synchronous circuit is enabled. This creates a problem because circuits such as control (For example, Y address decoder which is controlled by internal signal ICLK) and data output circuits on the semiconductor memory device will be controlled at different timings in the test mode than in a normal mode. This problem can cause circuits to become more complex in order to improve operating margins for both the case where the synchronous circuit is enabled and the case where the synchronous circuit is disabled. Also, externally, the semiconductor memory device will be producing data at a different timing in the test mode than in a normal mode. Thus, it may become necessary to test the control system again and/or interface with another test on another tester. These problems can make the characterization of the semiconductor memory device more complex and unreliable.

In view of the above discussion, it would be desirable to provide a semiconductor memory device, such as an SDRAM, that operates in similar timings in both a normal mode in which a synchronous circuit is enabled and in a test mode in which a synchronous circuit is disabled.

SUMMARY OF THE INVENTION

According to the present invention, a semiconductor memory device having an internal signal generator that receives an external clock and generates internal signals. The internal signals having a time delay between them when the semiconductor memory operates in a normal mode of operation. In a test mode of operation the internal signal generator enables a signal delay path to enable the internal signals to have the same time delay between them in the test mode as the normal mode.

According to one aspect of the present invention, the internal signal generator includes a synchronous circuit that generates an internal signal by detecting the cycle time of an external clock.

According to another aspect of the present invention, the internal signal generator includes a timing control circuit that generates an internal signal. The timing control circuit includes a delay stage that delays the internal signal when the semiconductor memory device is in a test mode.

According to another aspect of the present invention, a first stage circuit receives an external clock and generates a first stage output. The timing control circuit receives the first stage output and generates an internal control signal that is delayed when in the test mode of operation as compared to a normal mode of operation.

According to another aspect of the invention, the timing control circuit includes a selection circuit that selects a signal path for the generation of an internal signal, which includes the delay circuit when in a test mode of operation and selects a signal path without the delay circuit when in a normal mode of operation. The selection circuit includes transfer gates controllable by a test mode signal.

According to another aspect of the invention, the synchronous circuit receives a first stage output and generates an internal signal. The synchronous circuit correctly operates at a certain frequency range in the normal mode of operation. The test mode is operated at a frequency range in which the frequency circuit does not operate correctly. The internal signal from the synchronous circuit has the same timing as internal signal from the timing control circuit when in the test mode of operation as in the normal mode of operation.

According to another aspect of the present invention, a timing control circuit receives the output of a synchronous circuit and generates an internal signal being delayed by the timing control circuit when operating in a test mode as compared to the delay when operating in a normal mode. The delay being adjustable for operation at various clock frequencies.

According to another aspect of the present invention, an output circuit is synchronously controlled by an internal signal generated by an internal signal generator, such that the internal signals have the same timing with respect to each other in a normal mode of operation as in a test mode of operation.

According to another aspect of the present invention, a first and second internal signal generators that receive a first and second external clock and generate internal signals. The internal signals having a time delay between them when the semiconductor memory operates in a normal mode of operation. In a test mode of operation the first and second internal signal generators enable signal delay paths to enable the internal signals to have the same time delay between them in the test mode as the normal mode.

DETAILED DESCRIPTION OF THE EMBODIMENTS

Various embodiments of the present invention will now be described to in detail with reference to a number of drawings.

Figure 1:
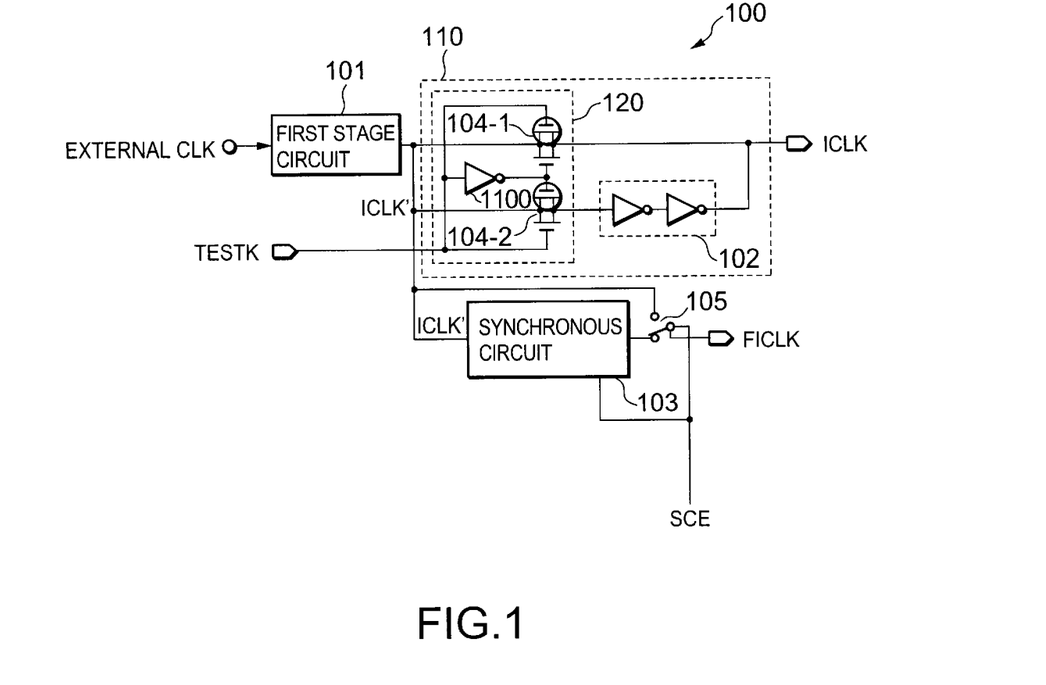
FIG. 1 is a circuit diagram of an internal signal generator according to a first embodiment.

Referring now to FIG. 1, an internal signal generator according to a first embodiment is set forth in a circuit schematic diagram and given the general reference character 100. An internal signal generator 100 may include a first stage circuit 101, a timing control circuit 110 and a synchronous circuit 103. A first stage circuit 101 can receive an externally generated system clock (external CLK) and may produce an internal signal ICLK'. Synchronous circuit 103 can receive the internal signal ICLK' as an input and may generate an internal signal FICLK. Timing control circuit 110 may receive internal signal ICLK' as an input and may generate internal signal ICLK.

Timing control circuit 110 may include a selection circuit 120 and a delay circuit 102. Timing control circuit 110 can receive internal signal ICLK', and test mode signal TESTK as an input and may produce internal signal ICLK as an output.

Selection circuit 120 may include transfer gates (104-1 and 104-2) and inverter 1100. Selection circuit 120 may receive internal signal ICLK' and test mode signal TESTK as inputs. Depending on the logic level of test mode signal TESTK, a selection circuit 120 may either couple internal signal ICLK' to internal signal ICLK or alternatively to delay circuit 102. Transfer gates (104-1 and 104-2) may include complementary pass gates, such as a p-channel IGFET (insulated gate field effect transistor) in parallel with an n-channel IGFET.

Delay circuit 102 may include an even number of inverters, and in the first embodiment may be two inverters arranged in series.

Synchronous circuit 103 may produce internal signal FICLK of suitable timing by detecting a frequency of internal signal ICLK' which may be output from first stage circuit 101. Thus, internal signal FICLK can be synchronized with external CLK. Synchronous circuit 103 may be a frequency synchronous circuit such as a DLL (delay locked loop) circuit or a PLL (phase locked loop) circuit, to name just two examples. Input signal FICLK may control the timing of an output circuit, such as output circuit (802a and 802b) in FIGS. 8a and 8b. Synchronous circuit 103 can be activated by synchronous circuit enable signal SCE. A selection circuit 105 can select one of the output of the synchronous circuit 103 and internal signal ICLK' to output the selected signal as the internal signal FICLK in response to the signal SCE. That is, when the signal SCE has active level, the circuit 103 is activated and the selection circuit 105 can output the output of the circuit 103 as the internal signal FICLK. When the signal SCE is non-active level, the circuit 103 is dis-activated and the selection circuit 105 can output the internal signal ICLK' as the as the internal signal FICLK.

A test mode signal TESTK may have a high logic level when internal signal generator 100 is operating according to a test mode, and a low logic level when internal signal generator 100 is operating according to a normal mode. When the test mode signal TESTK is low, selection circuit 120 generates internal signal ICLK by passing internal signal ICLK' through transfer gate 104-1. Thus, internal signal ICLK can be essentially the same as internal signal ICLK' as generated from first stage circuit 101. When test mode signal TESTK is high, selection circuit 120 generates internal signal ICLK by passing the internal ICLK' through transfer gate 104-2 and delaying it by a delay time of delay circuit 102. Thus, internal signal ICLK can be delayed with respect to internal signal ICLK' as generated from first stage circuit 101.

The operation of internal signal generator 100 of FIG. 1 will now be explained with reference to FIGS. 2, 7, and 9.

Figure 2:
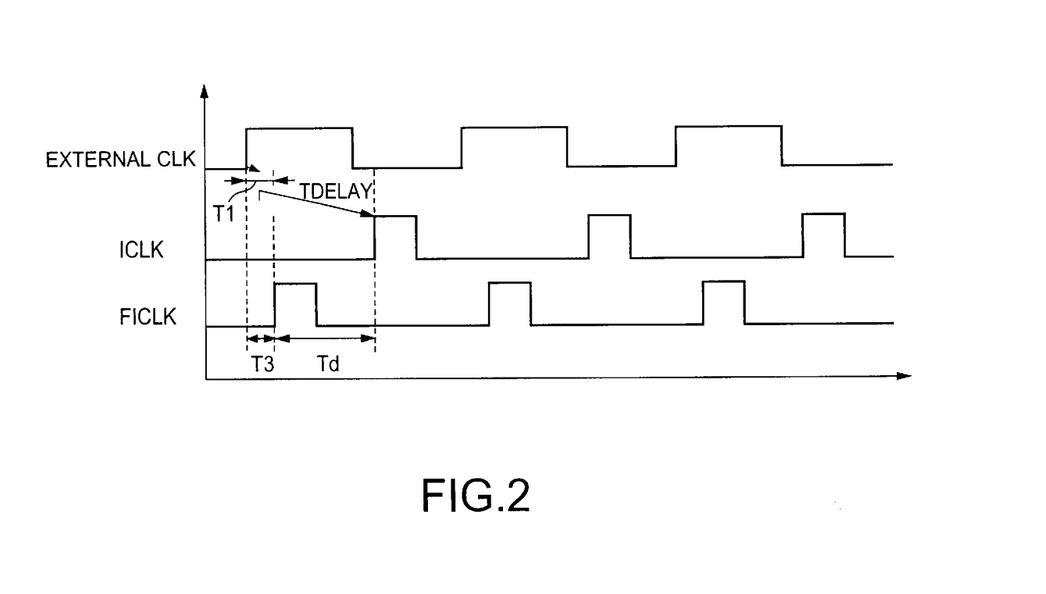
FIG. 2 is a timing diagram illustrating the operation of an internal signal generator of FIG. 1.

Referring now to FIG. 2, a timing diagram shows the operation of internal signal generator 100 of FIG. 1, when operating in a test mode of the present invention. FIG. 7 is a timing diagram illustrating data read timing under a normal mode of operation. FIG. 9 is a timing diagram illustrating conventional data read timing under a test condition.

As shown in FIG. 7, internal signal ICLK may be generated at a delay of T1 after the rising edge of external CLK. Under a normal mode, the circuit 103 is activated and the selection circuit 105 selects the output of the circuit 103 by the signal SCE. Internal signal FICLK is generated by synchronous circuit 103 based on internal signal ICLK such that the rising edge of internal signal FICLK occurs at a time T2 from the rising edge of external CLK. The following explanation will be made on the assumption that a time from the rising edge of internal signal FICLK to the rising edge of internal clock is T1+T2=Td.

When the semiconductor memory device is tested using a tester which can produce and measure signals at a frequency that can be high enough to operate synchronous circuit 103, internal signal ICLK and internal signal FICLK may be produced in a normal fashion as shown in FIG. 7. In this case, test mode signal TESTK is set to the normal mode (i.e. test mode signal TESTK is set to a low logic level) and transfer gate 104a may allow internal signal ICLK' to pass through as internal signal ICLK. Thus, a semiconductor memory device may be tested by using internal signal ICLK generated from the first stage circuit 101 and internal signal FICLK generated from synchronous circuit 103.

When the semiconductor memory device is tested using a tester which cannot produce and measure signals at a frequency that can be high enough to operate the synchronous circuit 103, internal signal ICLK and internal signal FICLK may be produced in a test mode fashion as shown in FIG. 2. Under a test mode, the circuit 103 becomes non-activated and the selection circuit 105 selects the output of the first stage circuit 101 based on the signal SCE. In this case, test mode signal TESTK is set to the test mode (i.e. test mode signal TESTK is set to a high logic level) and transfer gate 104b may allow internal signal ICLK' to pass through delay circuit 102 to produce internal signal ICLK. Thus, a semiconductor memory device may be tested by using internal signal ICLK generated from the first stage circuit 101 and delay circuit 102, and using internal signal FICLK generated from first stage circuit 101. The delay time of delay circuit 102 is set to be approximately equal to Tdelay 32 Td−(T3−T1). Thus internal signal ICLK and internal signal FICLK may have timings with respect to external CLK as illustrated in FIG. 2. However, it should be noted that the delay time of delay circuit 102 can be shortened or extended as needed as long as the desired test is not negatively influenced.

When internal signal ICLK is delayed with respect to external CLK, the internal control circuitry (not shown) can be delayed. This may shift the setup/hold time for external control signals, external address signals, and/or external data signals relative to external CLK. Also, the data valid timings for data signals produced from the semiconductor memory may be shifted relative to external CLK. The test mode of the present invention may be used when a semiconductor memory device is tested at a low frequency in which the synchronous circuit 103 may not be used. Thus, the setup/hold time for inputs and data strobe (sample) timing for outputs may be delayed by one internal signal ICLK. Input signal timing and output signal sampling can be modified to give sufficient margins in accordance with the timing shift. When operating tests using the test mode of the present invention, setup/hold timing or access timings may not be tested and it may be sufficient to allow sufficient margins with respect to these timings.

According to the first embodiment, even in a test in which external CLK operates at a frequency in which synchronous circuit 103 cannot function correctly, the internal timing on a semiconductor memory device can be the same as if operating in a normal mode. This can be accomplished by delaying internal signal ICLK, thus internal signal FICLK may have the same timing relation to internal signal ICLK in a test mode as in a normal mode even if synchronous circuit 103 is disabled. This can be applicable to tests done in wafer form, such as a multi-probe or laser-probe type test, as just two examples. The invention may also be applicable to tests done in package form. One such example could be a burn-in type test. The invention can allow the timing of the interface/control to operate in a similar manner to the normal operation, thus there may not be a need to conduct another test in order to test the interface/control. The invention may improve the accuracy of data taken in a test performed in a lower class (end) test system and thus, may give a better correlation between this data and data taken in a test performed in a higher class (end) test system.

This is in contrast to the timing diagram of FIG. 9, in which a frequency circuit is not operable and internal signal ICLK and internal signal FICLK have timings with respect to each other that are vastly different than in a normal operation.

Figure 3:
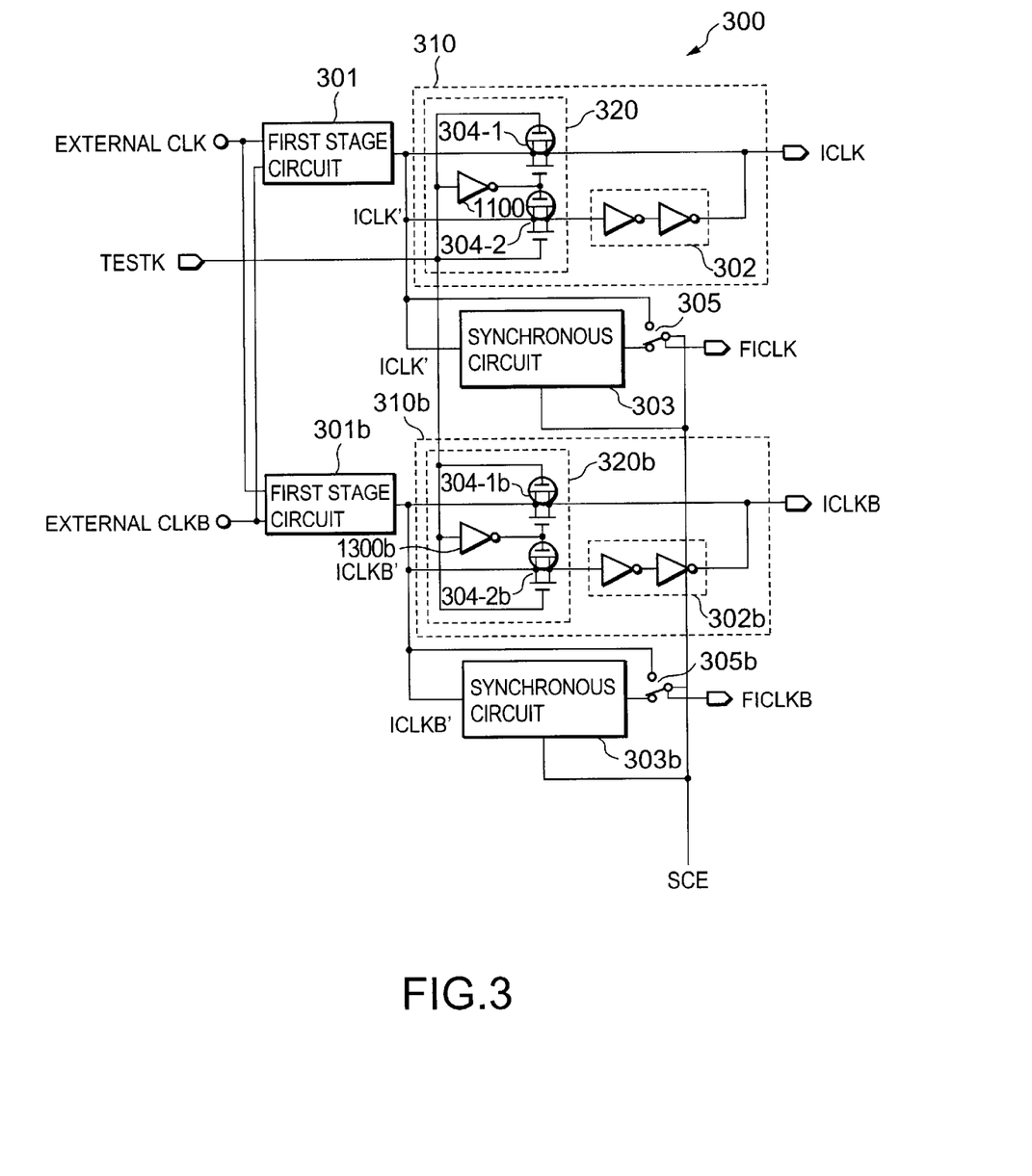
FIG. 3 is a circuit diagram of an internal signal generator according to a second embodiment.

Referring now to FIG. 3, an internal signal generator according to a second embodiment is set forth in a circuit schematic diagram and given the general reference character 300. Internal signal generator 300 can include similar constituents as internal signal generator 100 set forth in FIG. 1. To that extent, like constituents will be referred to by the same reference character, but with the first digit being a "3" instead of a "1."

Internal signal generator 300 may be applied to a synchronous memory, such as an SDRAM, and more particularly to a synchronous memory operating at a "double data rate" (DDR), such as a DDR-SDRAM. Internal signal generator 300 of FIG. 3 is similar to internal signal generator 100 of FIG. 1 with the addition of a first stage circuit 301*b*, a timing control circuit 310*b*, a synchronous circuit 303*b* and a selection circuit 305-2. First stage circuit 301*b* may receive external CLKB and output internal signal ICLKB'. An external signal CLKB may be an externally generated system clock that is 180 degrees out of phase with external CLK or simply a logical inversion of external CLK. First stage circuit 301*b* may be a differential type input buffer in which external CLK may also be received. Synchronous circuit 303*b* can receive the internal signal ICLKB' as an input and may generate an internal signal FICLKB. Timing control circuit 310*b* may receive the internal signal ICLKB' as an input and may generate an internal signal ICLKB.

Timing control circuit 310*b* may include a selection circuit 320*b* and a delay circuit 302*b*. The timing control circuit 310*b* can receive the internal signal ICLKB', and a test mode signal TESTK as an input and may produce an internal signal ICLKB as an output.

Selection circuit 320*b* may include transfer gates (304-1*b* and 304-2*b*) and an inverter 1300*b*. Selection circuit 320*b* may receive an internal signal ICLKB' and a test mode signal TESTK as inputs. Depending on the logic level of the test mode signal TESTK, a selection circuit 320*b* may either couple the internal signal ICLKB' to the internal signal ICLKB or alternatively to the delay circuit 302*b*. Transfer gates (304-1*b* and 304-2*b*) may include complementary pass gates, such as a p-channel IGFET (insulated gate field effect transistor) in parallel with an n-channel IGFET.

Delay circuit 302*b* may include an even number of inverters, and in the first embodiment may be two inverters arranged in series.

Synchronous circuit 303*b* may produce an internal signal FICLKB of suitable timing by detecting a frequency of an internal signal ICLKB' which may be output from first stage circuit 301*b* when the circuit 303*b* receives an activated signal SCE. Thus, internal signal FICLKB can be synchronized with external CLKB. Synchronous circuit 303*b* may be a frequency synchronous circuit such as a DLL (delay locked loop) circuit or a PLL (phase locked loop) circuit, as just two examples. The input signal FICLKB may control the timing of an output circuit, such as an output circuit (802*a* and 802*b*) in FIGS. 8*a* and 8*b*. The selection circuit 305*b* can output the output of the circuit 303*b* as the internal signal FICLK when the circuit 305*b* receives an activated signal SCE. The selection circuit 305*b* can output the internal signal ICLKB' as the as the internal signal FICLK when the circuit 305*b* receives a non-activated signal SCE.

A test mode signal TESTK may have a high logic level when internal signal generator 300 is operating according to a test mode and a test mode signal TESTK may have a low logic level when internal signal generator 300 is operating according to a normal mode. The test mode signal TESTK is low., selection circuit 320*b* generates internal signal ICLKB by passing internal signal ICLKB' through transfer gate 304-1*b*. Thus, the internal signal ICLKB can be essentially the same as internal signal ICLKB' as generated from first stage circuit 301*b*. On the other hand, when a test mode signal TESTK may have a high logic level, a synchronous circuit enable signal SCE is rendered activated so that the circuit 303*b* is activated to produce a signal FICLKB. The selection circuit 305*b* selects the output of the circuit 303*b* to output it as a signal FICLKB. When the test mode signal TESTK is high, selection circuit 320*b* generates internal signal ICLKB by passing the internal signal ICLKB' through transfer gate 304-2*b* and delaying it by a delay time of delay circuit 302*b*. Thus, internal signal ICLK can be delayed with respect to internal signal ICLKB' as generated from first stage circuit 301*b*. On the other hand, when a test mode signal TESTK may have a low logic level, a synchronous circuit enable signal SCE is rendered non-activated so that the circuit 303*b* is not activated not to produce a clock FICLKB. The selection circuit 305*b* selects the output of the first stage circuit 301*b* to output it as a signal FICLKB.

The top half of internal signal generator 300 is configured and operates similarly to internal signal generator 100 of FIG. 1, except first stage circuit 301 may be a differential type input buffer in which external signal CLKB may also be received.

Figure 4:
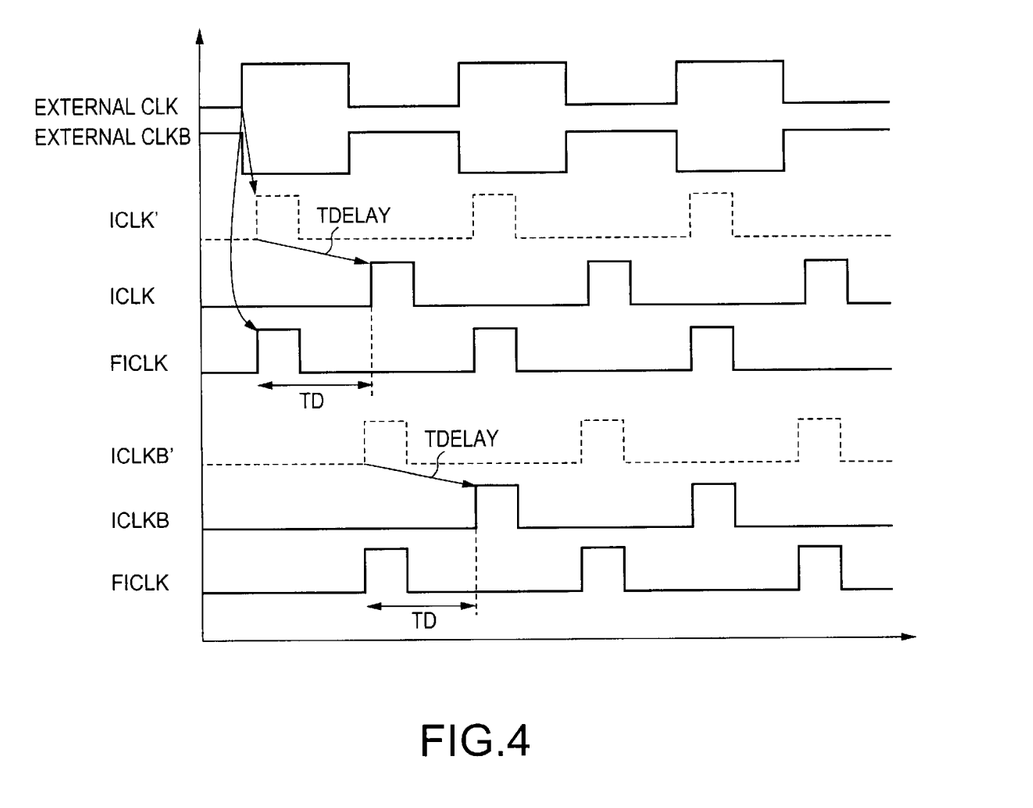
FIGS. 4 is timing diagram illustrating the operation of an internal signal generator of FIG. 3.

Referring now to FIG. 4, a timing diagram is set forth for explaining the operation of internal signal generator 300 of FIG. 3, when operating in a test mode of the present invention. The timing diagram of FIG. 4, shows that the operation of internal signal generator 300 can be similar to the operation of internal signal generator 100 of FIG. 1 with the exception that internal signal generator 300 includes an external CLKB which is used to generate internal signals ICLKB and FICLKB in a similar fashion that external CLK is used to generate internal signals ICLK and FICLK.

Figure 5:
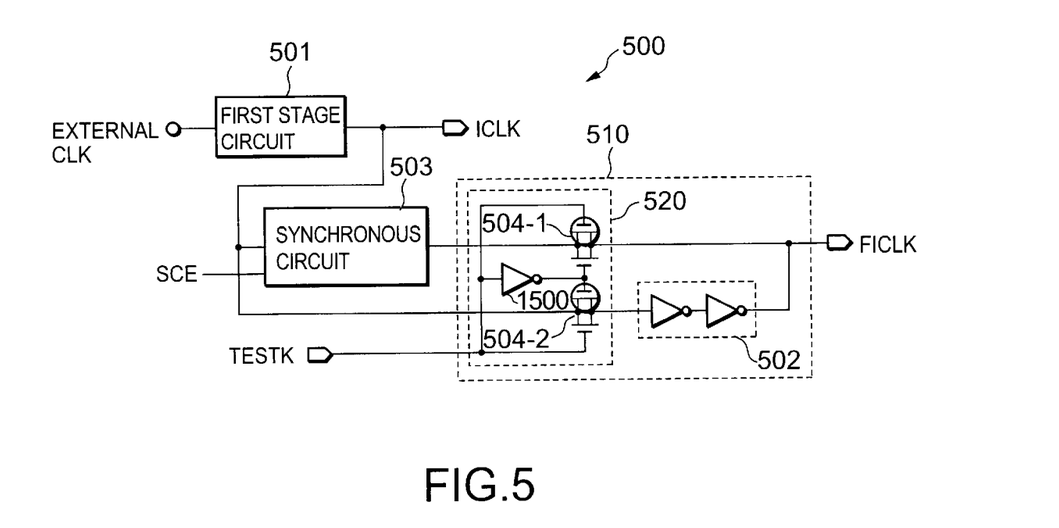
FIG. 5 is a circuit diagram of an internal signal generator according to a third embodiment.

Referring now to FIG. 5, an internal signal generator according to a third embodiment is set forth in a circuit schematic diagram and given the general reference character 500. The internal signal generator 500 can include similar constituents as the internal signal generator 100 set forth in FIG. 1. To that extent, like constituents will be referred to by the same reference character, but with the first digit being a "5" instead of a "1."

Internal signal generator 500 differs from internal signal generator 100 of FIG. 1, in that timing control circuit 510 is arranged to receive the output of synchronous circuit 503 and the output of first stage circuit 501 so as to selectively delay internal signal FICLK. Selection circuit 520 may receive an internal signal FICLK', an internal signal ICLK and a test mode signal TESTK as inputs. Depending on the logic level of the test mode signal TESTK, selection circuit 520 may either couple internal signal FICLK' to internal signal FICLK or alternatively couple internal signal ICLK to delay circuit 502. When internal signal ICLK is coupled to delay circuit 502, FICLK is delayed with respect to ICLK by the delay time of delay circuit 502. Synchronous circuit 503 may receives synchronous circuit enable signal SCE.

Figure 6A:
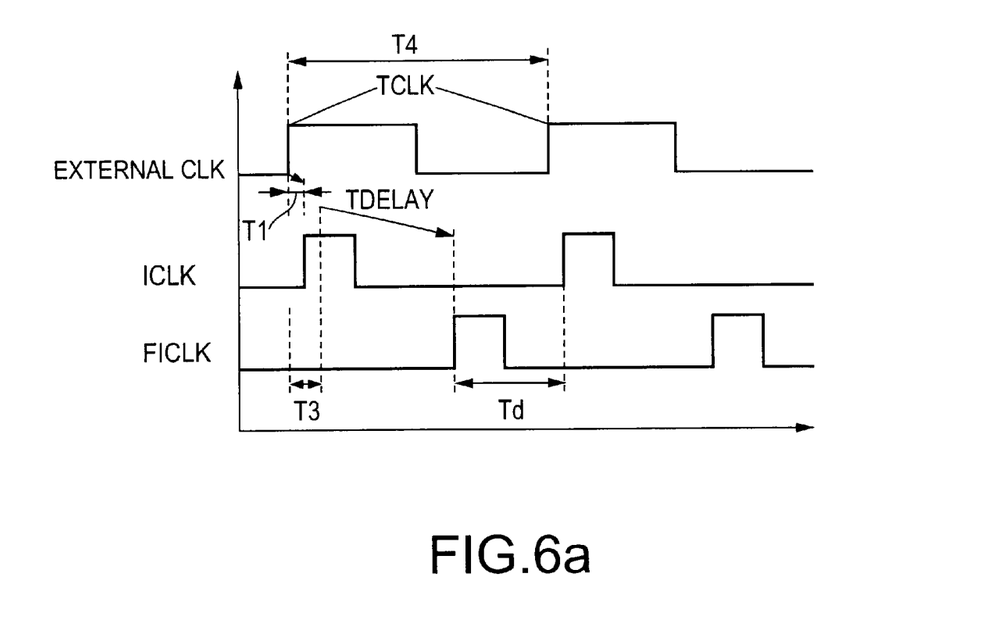
FIGS. 6a and 6b are timing diagrams illustrating the operation of an internal signal generator of FIG. 5.

Referring now to FIG. 6a, a timing diagram is set forth for explaining the operation of internal signal generator 500 of FIG. 5, when operating in a test mode of the present invention.

When the semiconductor memory device is tested using a tester which cannot produce and measure signals at a frequency that can be high enough to operate synchronous circuit 503, internal signal ICLK and internal signal FICLK may be produced in a test mode fashion as shown in FIG. 6. In this case, test mode signal TESTK is set to the test mode (i.e. test mode signal TESTK is set to a high logic level) and transfer gate 504-2 may allow internal signal ICLK to pass through delay circuit 502 to produce internal signal FICLK. Thus, a semiconductor memory device may be tested by using internal signal FICLK generated from delay circuit 502, by using internal signal ICLK generated from first stage circuit 501.

The delay time of delay circuit 502 is set to be approximately equal to Tdelay=T4+(T3−T1)−Td (Td is obtained from FIG. 7 in order to approximate normal mode), thus internal signal ICLK and internal signal FICLK may have timings with respect to external CLK as illustrated in FIG. 6(a). However, it should be noted that a delay time Tdelay of delay circuit 102 can be shortened or extended as needed as long as the desired test is not negatively influenced.

Figure 6B:
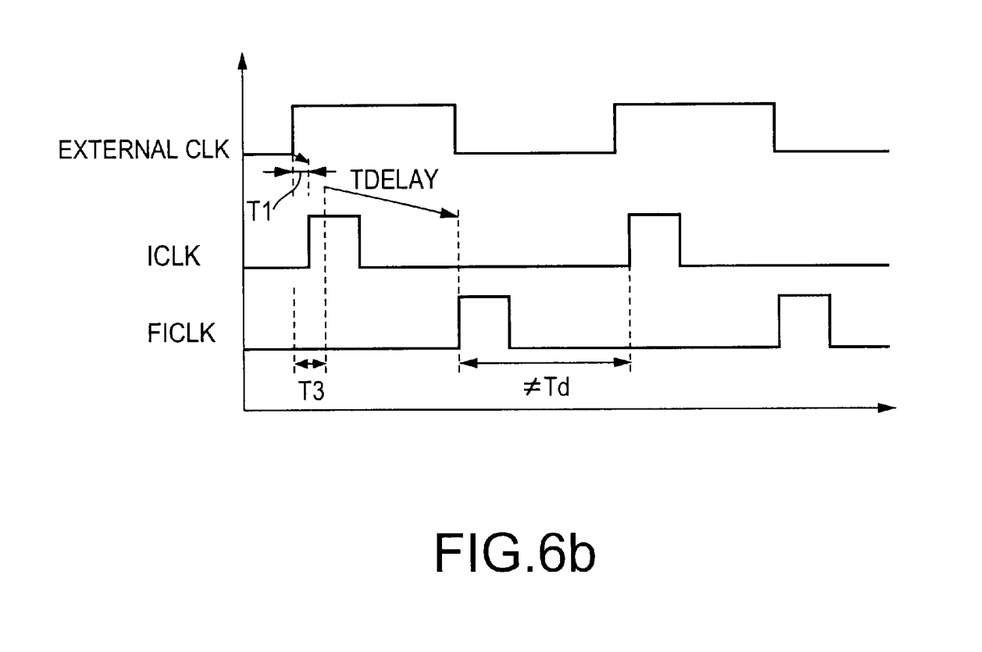

When the delay time of the delay circuit 502 with respect to internal signal ICLK to internal signal FICLK is kept constant as in the embodiment of FIG. 5, there may be a case in which this delay time cannot be set so as to approximate a normal mode. This is dependent on the external CLK period Tclk. Thus it may be necessary to have the design flexibility to take into account a fluctuation in the timing difference between internal signal FICLK and internal signal ICLK caused by a difference in Tclk. This is illustrated in the timing diagram of FIG. 6b.

When it may not be possible to design in enough margin to absorb fluctuations in the timing differences between internal signal FICLK and internal signal ICLK caused by the differences in the period Tclk of the external CLK, delay circuit 502, can be a plurality of delay circuits having different delay times. This plurality of delay circuits may be arranged to allow switch programmability between them. In this manner, delay time Tdelay of internal signal FICLK from synchronous circuit 503 can be changed in accordance with external CLK period Tclk. Thus., delay time Tdelay can be set to be similar to a normal timing relation between internal signal ICLK and internal signal FICLK of the semiconductor memory device.

The present invention can provide a semiconductor memory device in which, even in a test where a synchronous circuit can not operate because the maximum time period of an external clock exceeds the time period in which a synchronous circuit can operate, internal timings can be set in a manner that may can be the same as a normal operation.

In one approach, the test mode may be entered by using a test mode entry cycle and applying a "key" address corresponding to the disclosed test mode. Alternatively, the test mode may be entered by applying an over-voltage to a selected pin. Alternatively, the test mode may be entered by energizing a bond or probe pad that is not energized when the device is in a package. These are just exemplary methods of test mode entries in a semiconductor memory device and should not be construed as limiting the invention.

It is understood that embodiments described above have are exemplary and the present invention should not be limited to those embodiments. For example, transfer gates may be drivers with tri-state capabilities and test signal TESTK may enable or tri-state the drivers. Furthermore, delay circuits (102–502) may have a tri-state output that is enabled/disabled by test signal TESTK in order to prevent any signal conflicts in an internal signal (FICLK or ICLK) when in a normal mode of operation. Delay circuits may include capacitive elements, resistive elements, and/or long channel type transistors in order to generate a propagation delay. Though as shown in FIGS. 1, 3 and 5, there is nothing on the signal paths between the selection circuit 105, 305, 305b, 520 and the first stage circuit 101, 301, 301b, 501, logic circuits may be inserted between them. In this case, as matter of course, the internal signal ICLK is delayed to keep the timing relationship between the internal signal ICLK and the internal signal FICLK.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device having an internal signal generator that receives an external clock and generates a first and second internal signal, the internal signal generator, comprising:
   a first stage circuit coupled to receive the external clock and produce a first stage output;
   a synchronous circuit coupled to receive the first stage output and produce the second internal signal; and
   a timing control circuit coupled to receive the first stage output and produce the first internal signal at a timing control output;
   the timing control circuit including a delay circuit having a delay time;
   wherein the timing control circuit couples the first stage output to the timing control output and bypasses the delay circuit in a first mode of operation and couples the first stage output to the delay circuit to delay the generation of the first internal signal in a second mode of operation.

2. The semiconductor memory device of claim 1, wherein:
the first mode of operation is a normal mode and the second mode of operation is a test mode.

3. The semiconductor memory device of claim 2, wherein:
the synchronous circuit is enabled in the first mode of operation and disabled in the second mode of operation.

4. The semiconductor memory device of claim 2, wherein:
the first internal timing signal is generated at a predetermined time after the second timing signal in the normal mode; and
the first internal timing signal is generated at approximately the same predetermined time after the second timing signal in the test mode.

5. The semiconductor memory device of claim 2, wherein:
the external clock operates at a lower frequency in the test mode than in the normal mode.

6. The semiconductor memory device of claim 1, further including:
an output circuit for outputting data from the semiconductor memory device; and
the output circuit is coupled to receive the second internal signal.

7. The semiconductor memory device of claim 1, wherein the timing control circuit further includes:
a first and second transfer gate;
the first transfer gate being coupled between the first stage output and the timing control output, the first transfer gate providing a low resistance path between the timing control output and the first internal signal when in the first mode of operation; and
the second transfer gate being coupled between the first stage output and the delay circuit, the second transfer gate providing a low resistance path between the first stage output and the delay circuit when in the second mode of operation.

8. The semiconductor memory device of claim 1, wherein the semiconductor memory device is a synchronous dynamic random access memory.

9. A semiconductor memory device, comprising:
an internal signal generator coupled to receive an external clock and generate first and second internal signals wherein the first and second internal signals have a first time delay between them when the semiconductor device operates in a first mode; and
the internal signal generator includes a timing control circuit having a delay circuit for setting a second time delay between the first and second internal signals when the semiconductor device operates in a second mode.

10. The semiconductor memory device of claim 9, further including:
an output circuit for outputting data from the semiconductor device;
the output circuit is coupled to receive the second internal signal; and
the delay circuit delays the second internal signal when the semiconductor device operates in the second mode.

11. The semiconductor memory device of claim 10, further including:
the delay circuit includes a plurality of delay stages having different signal propagation delays.

12. The semiconductor memory device of claim 9, further including:
a synchronous circuit coupled to receive the first internal signal and generate the second internal signal when the semiconductor device operates in the first mode.

13. The semiconductor memory device of claim 9, wherein:
the first and second time delays are substantially equivalent.

14. The semiconductor memory device of claim 9, further including:
an output circuit for outputting data from the semiconductor device;
the output circuit is coupled to receive the second internal signal; and
the delay circuit delays the first internal signal when the semiconductor device operates in the second mode.

15. A semiconductor memory device, comprising:
a first input buffer coupled to receive a first external clock and generate a first buffer output;
a test signal indicating a test mode when in a first logic level and a normal mode when in a second logic level;
a first timing control circuit coupled to receive the first buffer output and the test signal and generate a first internal signal, the first internal signal being delayed when the test signal has the first logic level as compared to when the test signal has the second logic level; and
a first synchronous circuit coupled to receive the first buffer output and generate a second internal signal;
wherein the time difference between the generation of the second internal signal and the generation of the first internal signal is substantially the same when the test signal has the first logic level or the second logic level.

16. The semiconductor device of claim 15, further including:
an output circuit coupled to receive the second internal signal and output data from the semiconductor memory device synchronously with the second internal signal.

17. A semiconductor device of claim 15, further including:
a second input buffer coupled to receive a second external clock and generate a second buffer output;
a second timing control circuit coupled to receive the second buffer output and the test signal and generate a third internal signal, the third internal signal being delayed when the test signal has the first logic level as compared to when the test signal has the second logic level; and
a second synchronous circuit coupled to receive the second buffer output and generate a fourth internal signal;
wherein the time difference between the generation of the fourth internal signal and the generation of the third internal signal is substantially the same when the test signal has the first logic level or the second logic level.

18. The semiconductor device of claim 17, wherein:

the output circuit is coupled to receive the fourth internal signal and output data from the semiconductor memory device synchronously with the fourth internal signal.

19. The semiconductor device of claim 17, wherein:

the first external clock and second external clock are logical complements.

20. The semiconductor device of claim 17, wherein:

the first input buffer receives the first external clock and second external clocks as differential inputs; and the second input buffer receives the first external clock and second external clock as differential inputs.

* * * * *